(12) United States Patent
Umeki et al.

(10) Patent No.: US 9,415,407 B2
(45) Date of Patent: Aug. 16, 2016

(54) ELECTROSTATIC COATING APPARATUS AND GROUNDED STATE CHECKING METHOD

(71) Applicants: TRINITY INDUSTRIAL CORP., Aichi-ken, Toyota-shi (JP); TOYOTA JIDOSHA KABUSHIKA KAISHA, Aichi-ken, Toyota-shi (JP)

(72) Inventors: Masayuki Umeki, Toyota (JP); Akihiro Kawamoto, Toyota (JP); Shigeki Fujiwara, Toyota (JP); Isamu Yamasaki, Toyota (JP); Yasunori Asada, Okazaki (JP); Kimiyoshi Nagai, Shizuoka-ken (JP)

(73) Assignees: TRINITY INDUSTRIAL CORP., Aichi-Ken, Toyota-Shi (JP); TOYOTA JIDOSHA KABUSHIKI KAISHA, Aichi-Ken, Toyota-Shi (JP)

( * ) Notice: Subject to any disclaimer, the term of this patent is extended or adjusted under 35 U.S.C. 154(b) by 0 days.

(21) Appl. No.: 14/432,452

(22) PCT Filed: Oct. 17, 2013

(86) PCT No.: PCT/JP2013/078126
§ 371 (c)(1),
(2) Date: Mar. 30, 2015

(87) PCT Pub. No.: WO2014/061716
PCT Pub. Date: Apr. 24, 2014

(65) Prior Publication Data
US 2015/0328648 A1    Nov. 19, 2015

(30) Foreign Application Priority Data

Oct. 17, 2012  (JP) .................. 2012-229424
Oct. 17, 2012  (JP) .................. 2012-229425
Oct. 17, 2012  (JP) .................. 2012-229426
Oct. 17, 2012  (JP) .................. 2012-229427

(51) Int. Cl.
| G01R 27/08 | (2006.01) |
| B05B 5/00 | (2006.01) |
| B05B 5/04 | (2006.01) |
| G01R 31/02 | (2006.01) |
| B05B 12/08 | (2006.01) |
| B05B 13/04 | (2006.01) |

(52) U.S. Cl.
CPC .................. *B05B 5/006* (2013.01); *B05B 5/04* (2013.01)*B05B 12/084* (2013.01); *G01R 31/025* ; (2013.01); *B05B 5/0407* (2013.01); *B05B 13/0431* (2013.01)

(58) Field of Classification Search
CPC .... G01N 27/06; G01R 19/0092; G01R 27/22; B05B 12/084; B05B 13/0431; B05B 5/006; B05B 5/025; B05B 5/04; B05B 5/0407; B05B 1/62
USPC .......................... 324/693, 600, 639, 649, 691
See application file for complete search history.

(56) References Cited

U.S. PATENT DOCUMENTS

| 4,433,296 | A | * | 2/1984 | Kolibas | ................... B05B 5/087 324/133 |
| 5,908,162 | A | * | 6/1999 | Klein | ..................... B05B 5/032 118/671 |
| 2005/0040262 | A1 | * | 2/2005 | Nagai | ................... B05B 5/0407 239/690 |

FOREIGN PATENT DOCUMENTS

| JP | 2002-186884 | 7/2002 |
| JP | 2003-071330 | 3/2003 |
| JP | 2005-058998 | 3/2005 |
| JP | 2008-119594 | 5/2008 |
| JP | 2012-071224 | 4/2012 |

OTHER PUBLICATIONS

International Search Report dated Dec. 17, 2013 from International Application No. PCT/JP2013/078126.

* cited by examiner

*Primary Examiner* — Tung X Nguyen
*Assistant Examiner* — Giovanni Astacio-Oquendo
(74) *Attorney, Agent, or Firm* — Beyer Law Group LLP

(57) ABSTRACT

An electrostatic coating apparatus includes: a spray gun configured to spray a coating material onto a coating object; a voltage application device configured to apply a high voltage to the spray gun; and a current measurement device configured to measure electric current flowing through the spray gun. When the spray gun, which is in a state of not spraying the coating material onto the coating object and is under application of the high voltage from the voltage application device, is located at a distance from the coating object, the electric current flowing through the spray gun is measured by the current measurement device. A grounded state of the coating object is checked, based on the measured electric current. This shortens the time required for checking the grounded state, while allowing for downsizing and simplified configuration of production equipment and reduction of equipment cost.

22 Claims, 11 Drawing Sheets

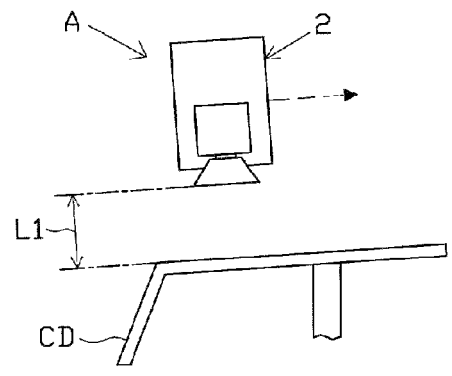
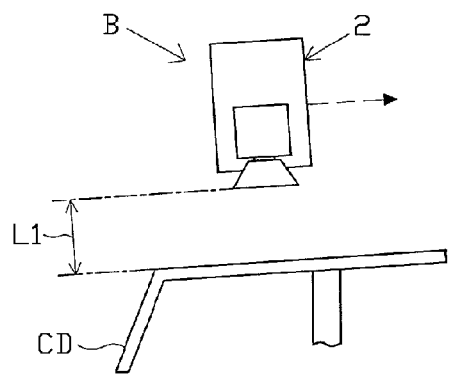
FIG. 6A            FIG. 6B
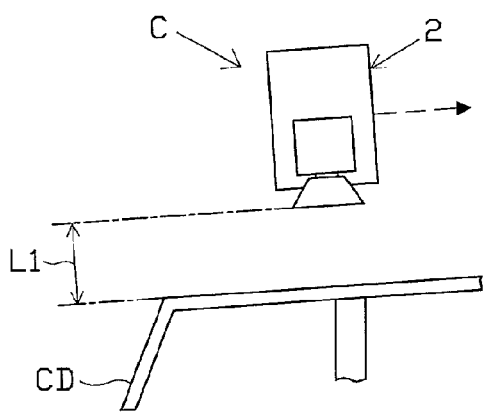
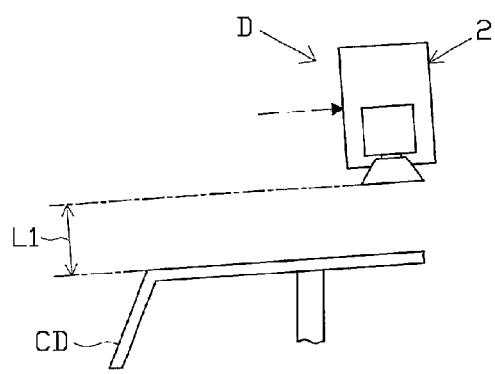
FIG. 6C            FIG. 6D

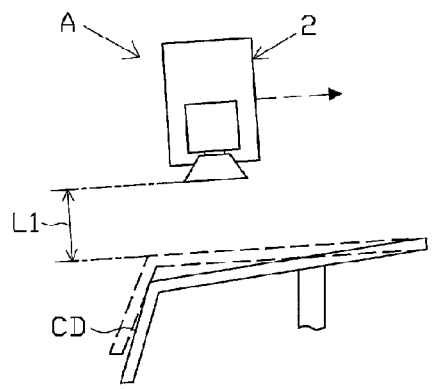 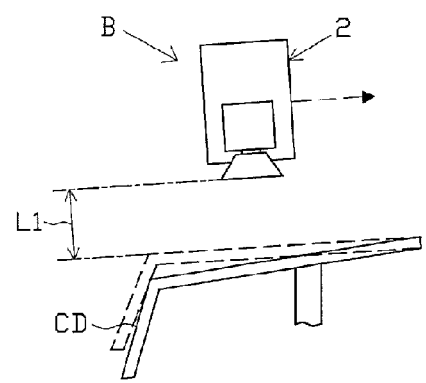
FIG. 9A    FIG. 9B
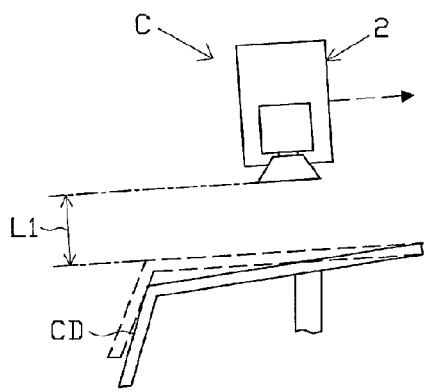 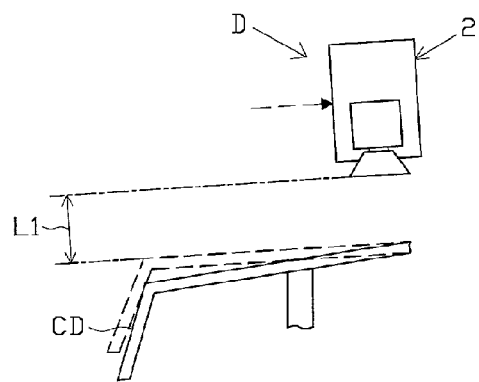
FIG. 9C    FIG. 9D

ELECTROSTATIC COATING APPARATUS AND GROUNDED STATE CHECKING METHOD

CLAIM OF PRIORITY

This application is a National Phase of International Patent Application No. PCT/JP2013/078126, filed on Oct. 17, 2013, which claims priority to Japanese Patent Application Nos. 2012-229424, 2012-229425, 2012-229426, and 2012-229427, all filed on Oct. 17, 2012, each of which is hereby incorporated by reference.

BACKGROUND OF THE INVENTION

1. Field of the Invention

The present invention relates to an electrostatic coating apparatus and more specifically relates to a technique of checking the grounded state of a coating object.

2. Description of the Related Art

In the case of electrostatic coating, at least a specific area (coating surface) of a coating object where a coating material is to be applied needs the electrical conductivity. When a coating object having high insulation property, such as a resin component, is subject to electrostatic coating, the electrical conductivity is given to the coating object generally by mixing a conductive material such as carbon black with the constituent material of the coating object or by forming a conductive covering (conductive primer) on the surface of the coating object. During electrostatic coating, the coating object (coating surface) is grounded.

A difference in conductive performance between the respective areas of the coating object (coating surface) causes a variation in amount of application of the coating material, which may result in the non-uniform thickness of the coating layer or the uneven color of the coating layer. Unreliable grounding connection of the coating object (coating surface) causes the charge to accumulate on the coating object (coating surface) during electrostatic coating, which may result in generation of a spark between the coating object and a jig or the like located in the periphery of the coating object. It is accordingly determined whether the grounded state of the coating object is good or bad, prior to electrostatic coating.

A conventionally known technique of checking the grounded state of a coating object brings a specified terminal into contact with the coating object (coating surface) and measures the resistance value of the coating object. This method may, however, damage the coating object by the contact of the terminal. Accordingly, a proposed technique applies the charge to the coating object to charge the coating object and subsequently measures the surface potential on the coating object. This enables the grounded state of the coating object to be checked without being in contact with the coating object (see, for example, Japanese Laid-Open Patent Application No. 2005-58998A). Another proposed technique employs a spray gun used for electrostatic coating to apply the charge to the coating object and measure the surface potential. This does not need any special device for checking the grounded state and thereby tries to shorten the production line and reduce the equipment cost (see, for example, Japanese Laid-Open Patent Application No. 2012-71224A).

BRIEF DESCRIPTION OF THE INVENTION

The above prior art needs the two processes, i.e., the process of applying the charge to the coating object and the process of measuring the surface potential on the coating object. This may undesirably extend the time required for checking the grounded state of the coating object. In order to shorten the time required for checking, the proposed technique provides, for example, the device of applying the charge to the coating object separately from the device of measuring the surface potential on the coating object to perform measurement of the surface potential simultaneously with application of a voltage to the coating object (for example, the technique described in the above patent literature 2 provides a plurality of spray guns). This, however, may cause size expansion and complicated configuration of production equipment and increase of equipment cost.

By taking into account the above circumstances, an object of the invention is to provide an electrostatic coating apparatus and a grounded state checking method, which remarkably shorten the time required for checking the grounded state of the coating object and allows for downsizing and simplified configuration of production equipment and reduction of equipment cost.

The following describes some aspects suitable to solve the above problems, as well as the functions and the advantageous effects characteristic of the respective aspects as appropriate.

Aspect 1

There is provided an electrostatic coating apparatus, comprising: a spray gun configured to spray a coating material onto a coating object; a voltage application device configured to apply a high voltage to the spray gun; and a current measurement device configured to measure electric current flowing through the spray gun. The electrostatic coating apparatus is configured to locate the spray gun, which is in a state of not spraying the coating material onto the coating object and is under application of the high voltage from the voltage application device, at a distance from the coating object, so as to measure the electric current flowing through the spray gun by the current measurement device. The electrostatic coating apparatus is configured to check a grounded state of the coating object, based on the electric current measured by the current measurement device.

The above aspect 1 enables the electrostatic coating apparatus having the spray gun to check the grounded state of the coating object without using any special device. This allows for downsizing and simplified configuration of production equipment and reduction of equipment cost.

Additionally, the above aspect 1 measures the electric current flowing through the spray gun, which is under application of a voltage from the voltage application device, by using the current measurement device and checks the grounded state of the coating object, based on the measured electric current. In other words, the above aspect 1 is configured to obtain the electric current used for checking the grounded state of the coating object during application of a voltage to the spray gun and to measure the electric current flowing through the spray gun simultaneously with application of the voltage to the spray gun (i.e., by one process). This remarkably shortens the time required for checking the grounded state of the coating object and thereby enhances the productivity.

In the above aspect 1, there is no need to provide a plurality of spray guns, in order to shorten the time for checking. This more effectively allows for downsizing and simplified configuration of production equipment and reduction of equipment cost.

In order to ensure stable electrostatic coating, the electric current flowing through the spray gun may be measured during coating. The electric current flowing through the spray gun during coating is significantly varied by the effects of, for example, the coating material and the coating trajectory. Checking the grounded state of the coating object based on the electric current flowing through the spray gun during coating may thus significantly reduce the accuracy of checking. The electric current flowing through the spray gun during non-coating is, on the other hand, hardly varied by the effects of, for example, the coating material and the coating trajectory. Checking the grounded state of the coating object based on the electric current flowing through the spray gun in the state of not spraying the coating material onto the coating object like the above aspect 1 ensures the high accuracy of checking.

Aspect 2

There is provided the electrostatic coating apparatus according to aspect 1, which is configured to locate the spray gun which is under application of the high voltage from the voltage application device, in at least three or more different positions at a fixed distance from the coating object located at its normal position, so as to measure the electric current flowing through the spray gun by the current measurement device at each of the three or more different positions. The electrostatic coating apparatus is configured to check the grounded state of the coating object, based on a plurality of the electric currents measured by the current measurement device.

When the coating object is located at a position shifted from its normal position, the distance between the coating object and the spray gun may differ according to the position. The measurement of electric current may accordingly vary with a variation in distance. This may result in erroneous determination that the grounded state is abnormal, irrespective of the normal grounded state. Additionally, when the coating object with keeping the misalignment of the position is subject to the coating process, the coating object may have non-uniform coating.

The above aspect 2 is, however, configured to locate the spray gun which is under application of a voltage, in at least three or more different positions at a fixed distance from the coating object located in its normal position, measure the electric current flowing through the spray gun at the respective positions and check the grounded state based on a plurality of the measured electric currents. Accordingly, this further enhances the accuracy of checking the grounded state.

Additionally, the above aspect 2 determines whether or not the position of the coating object is misaligned, based on the plurality of measured electric currents. This more effectively prevents the coating object with keeping the misalignment of the position from being subject to the coating process and more effectively controls the position of the spray gun relative to the coating object to a desired position in the coating process. This results in effectively preventing a potential non-uniform coating and thus further enhances the coating quality.

Aspect 3

There is provided the electrostatic coating apparatus according to either aspect 1 or aspect 2, further comprising: a surface potential measurement device electrically connected with the spray gun and configured to measure a surface potential on the coating object. The electrostatic coating apparatus is configured to locate the spray gun, which is in the state of not spraying the coating material onto the coating object and is under application of the high voltage from the voltage application device, at a distance from the coating object, so as to charge the coating object, while being configured to locate the spray gun, which is under no application of the high voltage from the voltage application device, at a distance from the coating object, so as to measure the surface potential on the coating object by the surface potential measurement device. The electrostatic coating apparatus is configured to check the grounded state of the coating object, based on the electric current measured by the current measurement device and the surface potential measured by the surface potential measurement device.

The above aspect 3 is configured to measure the electric current flowing through the spray gun and also measure the surface potential on the coating object charged by the spray gun when the spray gun under application of a high voltage is located at a distance from the coating object. The above aspect 3 then checks the grounded state of the coating object, based on both the measured electric current and the measured surface potential. This remarkably enhances the accuracy of checking the grounded state, compared with a configuration of checking the grounded state only based on the surface potential.

Aspect 4

There is provided the electrostatic coating apparatus according to aspect 3, wherein when the grounded state of the coating object is abnormal, the electrostatic coating apparatus is configured to identify a cause of the abnormal grounded state, based on the electric current measured by the current measurement device and the surface potential measured by the surface potential measurement device.

The conductive covering (conductive primer) serves to provide the coating object with electrical conductivity and also enhance the adhesiveness of the coating material applied on the surface of the coating object, thus preventing the coating layer from being peeled off.

The grounded state of the coating object is made abnormal in the case of poor primer or in the case of poor grounding. In the state of poor primer, the conductive primer is not normally formed in part of the coating object. This provides the non-uniform thickness of the coating layer and may cause uneven coating or partial lack of coating. Even when there is no uneven coating or the like, this lowers the adhesiveness of the coating layer and may cause the coating layer from being readily peeled off. In the state of poor grounding, on the other hand, the coating object (conductive primer) has unreliable grounding connection. In this case, as described above, the charge accumulates on the coating object (conductive primer) during electrostatic coating. This may provide uneven coating or the like or may generate a spark between the coating object and a jig or the like located in the periphery of the coating object.

Electrostatic coating of the coating object in the state of poor grounding, may provide uneven coating but ensures the sufficient adhesiveness of the coating layer and is unlikely to peel off the coating layer as long as the conductive primer is normally formed. Accordingly, the poor grounding does not cause a significant problem on the quality of a resulting product, when the appearance of coating is normal without significant unevenness of coating.

Electrostatic coating of the coating object in the state of poor primer, on the other hand, lowers the adhesiveness of the coating layer and is likely to peel off the coating layer. Accordingly, the poor primer may cause a problem on the peel resistance of the coating layer even when the appearance of coating is normal without significant unevenness of coating.

The aspects described above detect the abnormal grounded state with high accuracy but cannot identify the cause of the abnormality as poor primer or poor grounding. Accordingly, a product having abnormal grounded state but normal appearance of coating may not be adequately treated (for example, the product is treated as a defective product in the case of poor primer, while the product is treated as a non-defective product in the case of poor grounding.)

The above aspect 4 can, however, identify the cause of the abnormal grounded state, based on the appearance of the measured electric current and the measured surface potential. When the cause of the abnormal grounded state is attributed to poor primer, a large quantity of charges locally accumulate in a specific area with poor primer. Accumulation of the large quantity of charges causes repulsion by the Coulomb's force to significantly affect the spray gun and makes the electric currently unlikely to flow through the spray gun. Accordingly, in the case of poor primer, the measured surface potential is relatively high, while the measured electric current is relatively low. When the cause of the abnormal grounded state is attributed to poor grounding, on the other hand, the charges are distributed over the entire surface of the conductive primer and do not locally accumulate. This reduces the effect of repulsion by the Coulomb's force on the spray gun and makes the electric current likely to flow through the spray gun. Accordingly, in the case of poor grounding, the measured surface potential is relatively low, while the measured electric current is relatively high. By taking advantage of these phenomena, the cause of the abnormal grounded state is attributable to poor primer or to poor grounding. As a result, a product having abnormal grounded state but normal appearance of coating can be adequately treated.

Aspect 5

There is provided the electrostatic coating apparatus according to aspect 4, which is configured to identify the cause of the abnormal grounded state by comparison between a value Y (kV) and a calculated value by substituting a value X (kV) into $-3$ ($\mu$A/kV)$\times$X+20 ($\mu$A), where the value X is calculated by subtracting the surface potential on the coating object in a normal grounded state measured by the surface potential measurement device from the surface potential on the coating object as a test object measured by the surface potential measurement device, and the value Y is calculated by subtracting the electric current on the coating object as the test object measured by the current measurement device from the electric current on the coating object in the normal grounded state measured by the current measurement device.

The above aspect 5 readily identifies the cause of the abnormal grounded state by comparing the value Y with the value calculated by substituting the value X into $-3X+20$.

More specifically, as described above, in the event of poor primer, the measured surface potential is relatively high, while the measured electric current is relatively low. This gives the relatively large value X and the relatively large value Y and thereby the relatively small value calculated by substituting the value X into $-3X+20$. Accordingly, the cause of the abnormal grounded state is attributable to poor primer when the value Y is larger than (or not less than) the value calculated by substituting the value X into $-3X+20$.

As describes above, in the event of poor grounding, the measured surface potential is relatively low, while the measured electric current is relatively high. This gives the relatively small value X and the relatively small value Y and thereby the relatively large value calculated by substituting the value X into $-3X+20$. Accordingly, the cause of the abnormal grounded state is attributable to poor grounding when the value Y is smaller than (or not greater than) the value calculated by substituting the value X into $-3X+20$.

Aspect 6

There is provided the electrostatic coating apparatus according to any one of aspects 3 to 5, which is configured to locate the spray gun, which is in the state of not spraying the coating material onto the coating object and is under application of the high voltage from the voltage application device, at a distance from the coating object, so as to measure the electric current flowing through the spray gun by the current measurement device and charge the coating object by the spray gun.

The above aspect 6 is configured to charge the coating object when the spray gun under application of the high voltage is located at a distance from the coating object for measurement of the electric current flowing through the spray gun. In other words, the above aspect 6 is configured to perform measurement of the electric current flowing through the spray gun simultaneously with charging the coating object (i.e., by one process). Accordingly, this effectively shortens the time required for checking the grounded state of the coating object and thereby enhances the productivity.

Aspect 7

There is provided the electrostatic coating apparatus according to any one of aspects 3 to 6, wherein the spray gun includes a first spray gun and a second spray gun. The electrostatic coating apparatus is configured to locate the first spray gun, which is under application of the high voltage from the voltage application device, at a distance from the coating object, so as to charge the coating object, while being configured to locate the second spray gun, which is under no application of the high voltage from the voltage application device, at a distance from the coating object, so as to measure the surface potential on the coating object by the surface potential measurement device.

The above aspect 7 is configured to start measurement of the surface potential using the second spray gun with respect to a specific charged area of the coating object where application of charge has been completed, while the coating object is being charged by the first spray gun. Accordingly, this further shortens the time required for checking the grounded state and thereby further enhances the productivity.

Aspect 8

There is provided the electrostatic coating apparatus according to any one of aspects 1 to 7, wherein a distance between the spray gun and the coating object during measurement of the electric current flowing through the spray gun by the current measurement device is made smaller than a distance between the spray gun and the coating object during coating of the coating object by the spray gun.

Here the "distance between the spray gun and the coating object" specifically means that the "distance between the spray gun and the coating object" located in its normal position (the same applies to the description hereinafter.)

The above aspect 8 more effectively increases the difference between the electric current flowing through the spray gun in the normal grounded state of the coating object and the electric current flowing through the spray gun in the abnormal grounded state of the coating object. This accordingly more facilitates determination of whether the grounded state of the coating object is normal or abnormal and thereby further enhances the accuracy of checking the grounded state.

Aspect 9

There is provided the electrostatic coating apparatus according to any one of aspects 3 to 7, wherein a distance between the spray gun and the coating object during measurement of the surface potential on the coating object by the surface potential measurement device is made smaller than a distance between the spray gun and the coating object during coating of the coating object by the spray gun.

The above aspect 9 more effectively increases the difference between the surface potential in the normal grounded state of the coating object and the surface potential in the abnormal grounded state of the coating object. This accordingly more facilitates determination of whether the grounded state of the coating object is normal or abnormal and thereby further enhances the accuracy of checking the grounded state.

Aspect 10

There is provided the electrostatic coating apparatus according to any one of aspects 1 to 9, wherein a distance between the spray gun and the coating object is not less than 40 mm and not greater than 100 mm during measurement of the electric current flowing through the spray gun by the current measurement device.

The above aspect 10 sets the distance between the spray gun and the coating object to not less than 40 mm during measurement of the electric current flowing through the spray gun. This effectively prevents the spray gun being in contact with the coating object and generation of a spark between the spray gun and a jig or the like located in the periphery of the coating object even in the case of misalignment of the position of the coating object. This results in enhancing the accuracy of checking the grounded state.

The above aspect 10 also sets the distance between the spray gun and the coating object to not greater than 100 mm during measurement of the electric current flowing through the spray gun. This sufficiently increases the difference between the electric current flowing through the spray gun in the normal grounded state and the electric current flowing through the spray gun in the abnormal grounded state. This further enhances the accuracy of checking the grounded state.

Aspect 11

There is provided the electrostatic coating apparatus according to any one of aspects 1 to 10, wherein a distance between the spray gun and the coating object is not less than 60 mm and not greater than 80 mm during measurement of the electric current flowing through the spray gun by the current measurement device.

The above aspect 11 sets the distance between the spray gun and the coating object to not less than 60 mm during measurement of the electric current flowing through the spray gun. This extremely effectively prevents the spray gun being in contact with the coating object and generation of a spark between the spray gun and a jig or the like.

The above aspect 11 also sets the distance between the spray gun and the coating object to not greater than 80 mm during measurement of the electric current flowing through the spray gun. This further increases the difference between the electric current flowing through the spray gun in the normal grounded state and the electric current flowing through the spray gun in the abnormal grounded state. This results in furthermore enhancing the accuracy of checking.

Aspect 12

There is provided a grounded state checking method of checking a grounded state of a coating object in an electrostatic coating apparatus comprising a spray gun configured to spray a coating material onto a coating object and a voltage application device configured to apply a voltage to the spray gun. The grounded state checking method comprises: measuring an electric current flowing through the spray gun when the spray gun, which is under application of a high voltage by the voltage application device, is located at a distance from the coating object; and checking a grounded state of the coating object, based on the measured electric current.

The above aspect 12 has the similar functions and advantageous effects to those of the aspect 1 described above.

Aspect 13

There is provided the grounded state checking method according to aspect 12, wherein the measuring the electric current flowing through the spray gun is performed when the spray gun, which is in a state of not spraying the coating material onto the coating object, is located in at least three different positions at a fixed distance from the coating object located in its normal position.

The above aspect 13 has the similar functions and advantageous effects to those of the aspect 2 described above.

Aspect 14

There is provided the grounded state checking method according to either aspect 12 or aspect 13, further comprising: charging the coating object and measuring a surface potential on the coating object when the spray gun, which is under application of a voltage by the voltage application device, is located at a distance from the coating object; and checking the grounded state of the coating object, based on the measured electric current and the measured surface potential.

The above aspect 14 has the similar functions and advantageous effects to those of the aspect 3 described above.

Aspect 15

There is provided the grounded state checking method according to aspect 14, further comprising: when the grounded state of the coating object is abnormal, identifying a cause of the abnormal grounded state, based on the measured electric current and the measured surface potential.

The above aspect 15 has the similar functions and advantageous effects to those of the aspect 4 described above.

Aspect 16

There is provided the grounded state checking method according to aspect 15, wherein the identifying the cause of the abnormal grounded state is performed by comparison between a value Y (kV) and a calculated value by substituting a value X (kV) into $-3$ ($\mu$A/kV)$\times$X$+20$ ($\mu$A), where the value X is calculated by subtracting the measured surface potential on the coating object in a normal grounded state from the measured surface potential on the coating object as a test object, and the value Y is calculated by subtracting the measured electric current on the coating object as the test object from the measured electric current on the coating object in the normal grounded state.

The above aspect 16 has the similar functions and advantageous effects to those of the aspect 5 described above.

Aspect 17

There is provided the grounded state checking method according to any one of aspects 14 to 16, further comprising: measuring the electric current flowing through the spray gun and charging the coating object by the spray gun when the spray gun, which is in a state of not spraying the coating material onto the coating object and is under application of a high voltage from the voltage application device, is located at a distance from the coating object.

The above aspect 17 has the similar functions and advantageous effects to those of the aspect 6 described above.

Aspect 18

There is provided the grounded state checking method according to any one of aspects 14 to 17, further comprising: starting measuring the surface potential on the coating object, while charging the coating object.

The above aspect 18 has the similar functions and advantageous effects to those of the aspect 7 described above.

Aspect 19

There is provided the grounded state checking method according to any one of aspects 12 to 18, wherein a distance between the spray gun and the coating object during measurement of the electric current flowing through the spray gun is made smaller than a distance between the spray gun and the coating object during coating of the coating object by the spray gun.

The above aspect 19 has the similar functions and advantageous effects to those of the aspect 8 described above.

Aspect 20

There is provided the grounded state checking method according to any one of aspects 14 to 18, wherein a distance between the spray gun and the coating object during measurement of the surface potential on the coating object is made smaller than a distance between the spray gun and the coating object during coating of the coating object by the spray gun.

The above aspect 20 has the similar functions and advantageous effects to those of the aspect 9 described above.

Aspect 21

There is provided the grounded state checking method according to any one of aspects 12 to 20, wherein a distance between the spray gun and the coating object is not less than 40 mm and not greater than 100 mm during measurement of the electric current flowing through the spray gun.

The above aspect 21 has the similar functions and advantageous effects to those of the aspect 10 described above.

Aspect 22

There is provided the grounded state checking method according to any one of aspects 12 to 21, wherein a distance between the spray gun and the coating object is not less than 60 mm and not greater than 80 mm during measurement of the electric current flowing through the spray gun.

The above aspect 22 has the similar functions and advantageous effects to those of the aspect 11 described above.

BRIEF DESCRIPTION OF THE DRAWINGS

FIGS. 6A through 6D are diagrams illustrating the spray gun located at respective positions A to D;

FIGS. 9A through 9D are diagrams illustrating the spray gun located at respective positions A to D when the coating object is located at the position shifted from its normal position;

DETAILED DESCRIPTION OF EMBODIMENTS OF THE INVENTION

The following describes some embodiments with reference to the accompanied drawings.

[First Embodiment]

Figure 1:
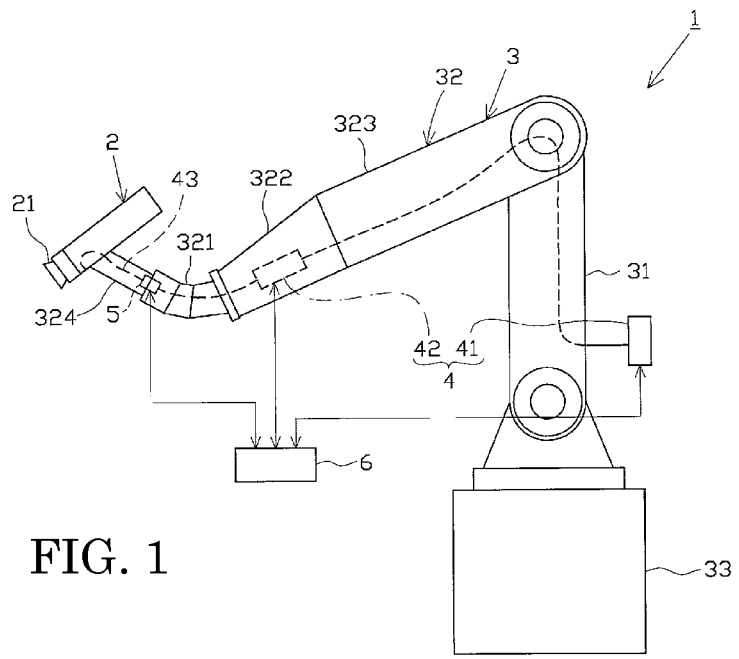
FIG. 1 is a diagram schematically illustrating the configuration of an electrostatic coating apparatus.
Figure 2:
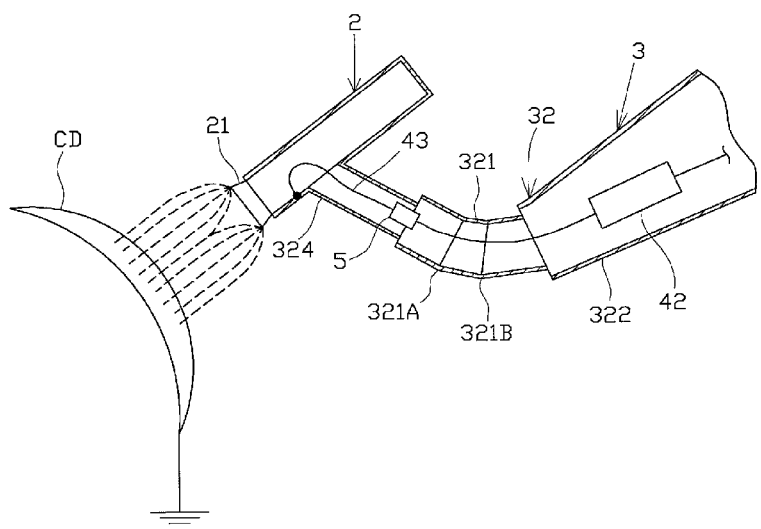
FIG. 2 is a diagram illustrating the structure of a spray gun and a robot arm.

An electrostatic coating apparatus 1 is used to electrostatically coat an object to be coated or a coating object CD in which at least a coating surface has electrical conductivity. As illustrated in FIGS. 1 and 2, the electrostatic coating apparatus 1 has one spray gun 2, a robot arm 3 configured to support the spray gun 2, a voltage application device and a current measurement device 5. According to this embodiment, a conductive primer made of a conductive material is provided on the normal coating surface of the coating object CD.

The spray gun 2 sprays a coating material onto the coating object CD and has a bell cup 21. The spray gun 2 has a rotary atomizing mechanism that rotates the bell cup 21 by non-illustrated drive means (for example, air motor) to atomize a liquid coating material spread on the inner surface of the bell cup 21 by the centrifugal force.

The robot arm 3 includes a vertical arm 31 having one end rotatably coupled with a base 33 and a horizontal arm 32 having one end rotatably coupled with the other end of the vertical arm 31. The spray gun 2 is attached to the other end of the horizontal arm 32. The spray gun 2 is movable relative to the coating object CD by rotating the vertical arm 31 and the horizontal arm 32 about respective pivot points.

More specifically, the horizontal arm 32 includes a first arm section 321, a second arm section 322 and a third arm section 323 which are linked in series. The first arm section 321 has two flexure portions 321A and 321B and is bendable at the respective flexure portions 321A and 321B. A cylindrical connection tube 324 is provided on the other end of the horizontal arm 32 to connect the first arm section 321 with the spray gun 2. The connection tube 324 is configured to be rotatable about its center axis relative to the first arm section 321. The orientation of the spray gun 2 relative to the coating object CD is adjustable by controlling the bending angle of the first arm section 321 and the rotation of the connection tube 324.

The voltage application device 4 is configured to generate a high voltage which is to be applied on the spray gun 2, and includes a voltage generator 41 and a voltage booster 42.

The voltage generator 41 generates a source voltage as the source of the high voltage to be applied to the spray gun 2. The generated voltage is input into the voltage booster 42. The voltage booster 42 boosts up the voltage input from the voltage generator 41 and applies the boosted high voltage through a transmission cable 43 to the spray gun 2. The voltage application device 4 is controlled by a controller 6 including a CPU and a RAM. The controller 6 is capable of controlling the voltage level to be applied to the spray gun 2 and the timing of voltage application.

The current measurement device 5 is provided downstream of the voltage booster 42 and is configured to measure the electric current flowing through the spray gun 2 (more specifically, the electric current flowing through the transmission cable 43 in this embodiment). The electric current measured by the current measurement device 5 is output to the controller 6.

The controller 6 is configured to determine the voltage level to be applied to the spray gun 2 and the timing of voltage application and also to check the grounded state of the coating object CD (more specifically, the conductive primer formed on the surface of the coating object CD in this embodiment), based on the electric current (current value) measured by the current measurement device 5.

Figure 3:
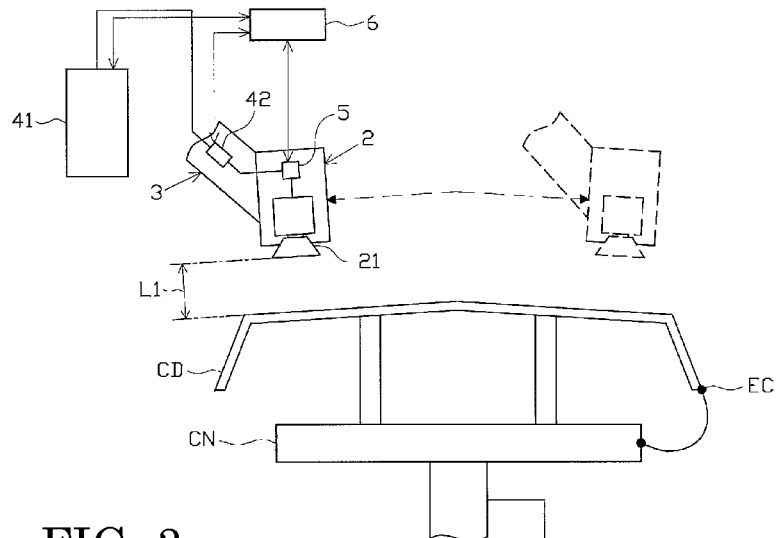
FIG. 3 is a diagram illustrating the spray gun when the grounded state of a coating object is checked.

The following describes a procedure of checking the grounded state of the coating object CD in detail. As illustrated in FIG. 3, in the state prior to starting electrical coating by the spray gun 2 onto the coating object CD with the conductive primer provided thereon (i.e., the state prior to spraying the coating material onto the coating object CD), the spray gun 2 is located at a distance from the coating object CD mounted on a predetermined conveyor belt CN. A distance L1 between the spray gun 2 and the coating object CD located at a normal position should be not less than 40 mm and not greater than 100 mm (more preferably not less than 60 mm and not greater than 80 mm). In general, the coating object CD (conductive primer) is electrically connected with the conveyor belt CN with a grounding clip EC, so as to be grounded.

As illustrated in FIG. 3, while repeating application of a negative high voltage (for example, −50 kV and preferably not lower than −60 kV and not higher than −40 kV) from the voltage application device 4 to the spray gun 2 and cancellation of such application, the procedure subsequently moves the spray gun 2 relative to the coating object CD along a predetermined trajectory (more specifically, a trajectory passing over the entire surface area of the conductive primer in this embodiment). The current measurement device 5 measures the electric current flowing through the spray gun 2 under application of the high voltage by the spray gun 2. During relative move of the spray gun 2, the distance between the spray gun 2 and the coating object CD located at the normal position is kept to the above distance L1.

The electric current (current value) measured by the current measurement device 5 is input into the controller 6. The controller 6 then determines the grounded state of the coating object CD, based on the input electric current.

Figure 4:
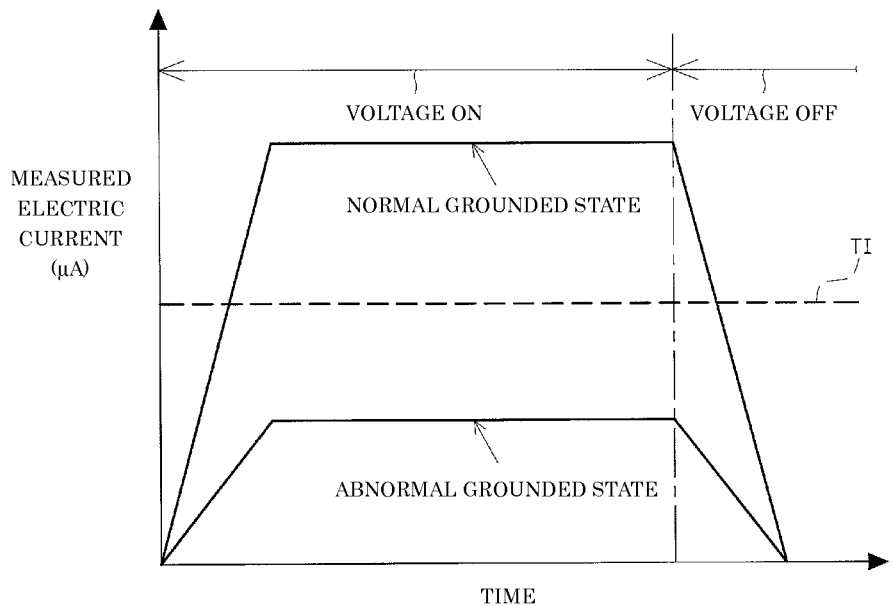
FIG. 4 is a graph showing electric currents measured by a current measurement device and a threshold current used to determine the grounded state of the coating object.

More specifically, in the case where the coating object CD (conductive primer) is normally grounded and the conductive primer is normally formed, the electric charge applied to the coating object CD by the spray gun 2 flows through the conductive primer toward the ground. This gives a relatively high potential difference between the spray gun 2 and the coating object CD (conductive primer) and results in a relatively large discharge from the spray gun 2. This accordingly causes a relatively high electric current to flow through the spray gun 2. By taking into account such state, the controller 6 determines that the grounded state of the coating object CD is normal when the maximum value of the electric current (current value) measured by the current measurement device 5 is not lower than a predetermined threshold current TI (µA) as shown in FIG. 4.

In the case where some abnormality occurs on the grounding connection of the coating object CD (conductive primer) (for example, when the grounding clip EC is not attached or when conductive performance between the coating object CD and the ground is reduced by, for example, adhesion of an insulating coating material onto the grounding clip EC) or in the case where the conductive primer is not provided normally (for example, when the conductive primer is not formed), on the other hand, the electric charge applied to the coating object CD by the spray gun 2 remains in the coating object CD. This gives a relatively low potential difference between the spray gun 2 and the coating object CD and results in a relatively small discharge from the spray gun 2. This accordingly causes a relatively low electric current to flow through the spray gun 2. By taking into account such state, the controller 6 determines that the grounded state of the coating object CD is abnormal when the maximum value of the electric current (current value) measured by the current measurement device 5 is lower than the predetermined threshold current TI. According to this embodiment, when the controller 6 determines that the grounded state of the coating object CD is abnormal, an operator or an equivalent is informed of the abnormality of the grounded state by a specific alarm device (not shown).

According to this embodiment, the distance L1 between the spray gun 2 and the coating object CD is not less than 40 mm and not greater than 100 mm (more preferably not less than 60 mm and not greater than 80 mm) during measurement of the electric current flowing through the spray gun 2 by the current measurement device 5 as described above. Setting the distance L1 to this range is attributed to the following reason.

As shown in Table 1, a difference between the electric current flowing through the spray gun 2 in the normal grounded state of the coating object CD and the electric current flowing through the spray gun 2 in the abnormal grounded state of the coating object CD (electric current difference) was measured by varying the voltage applied to the spray gun 2 and varying the distance L1 between the spray gun 2 and the coating object CD.

TABLE 1

| | | Distance L1 (mm) | | | | | | | | |
|---|---|---|---|---|---|---|---|---|---|---|
| | | 40 | 60 | 80 | 100 | 120 | 140 | 160 | 180 | 200 |
| Voltage Applied (kV) | −60 | 196 µA | 116 µA | 81 µA | 63 µA | 49 µA | 42 µA | 35 µA | 29 µA | 24 µA |
| | −50 | 134 µA | 92 µA | 66 µA | 50 µA | 39 µA | 32 µA | 27 µA | 22 µA | 19 µA |
| | −40 | 103 µA | 66 µA | 48 µA | 36 µA | 29 µA | 24 µA | 20 µA | 17 µA | 13 µA |

Setting the distance L1 to not less than 40 mm suppressed an excessive increase of the electric current difference. This sufficiently prevented generation of a spark between the spray gun 2 and a jig located in the periphery of the coating object CD. Setting the distance L1 to not less than 60 mm more effectively suppressed an excessive increase of the electric current difference and more effectively prevented generation of a spark. By taking into account these results, the distance L1 is set to not less than 40 mm (or more preferably to not less than 60 mm) according to this embodiment. Setting the distance L1 to not greater than 100 mm caused the electric current difference to not lower than 30 µA and facilitated determination of whether the grounded state was good or bad. Setting the distance L1 to not greater than 80 mm caused the electric current difference to not lower than 40 µA and more effectively facilitated determination of whether the grounded state was good or bad. By taking into account these results, the distance L1 is set to not greater than 100 mm (or more preferably not greater than 80 mm) according to this embodiment.

Figure 5:
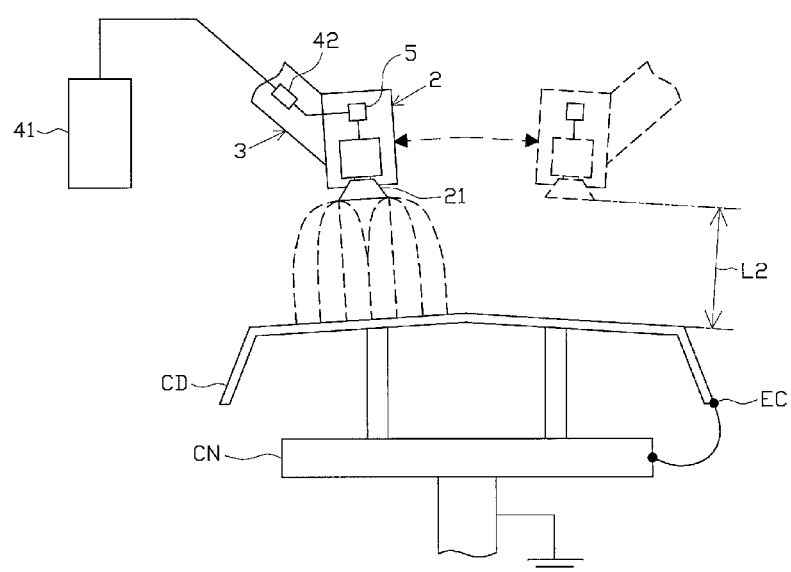
FIG. 5 is a diagram illustrating a distance between the spray gun and the coating object during coating of the coating object.

According to this embodiment, the distance L1 is set to be smaller than a distance L2 between the spray gun 2 and the coating object CD (for example, 150 mm to 200 mm) during electrostatic coating by the spray gun 2 as shown in FIG. 5.

As described above in detail, the electrostatic coating apparatus 1 of the embodiment having the spray gun 2 is configured to check the grounded state of the coating object CD without using any special device. This allows for downsizing and simplified configuration of production equipment and reduction of equipment cost.

Additionally, this embodiment is configured to obtain the electric current used for checking the grounded state of the coating object CD during application of a voltage to the spray gun 2. In other words, this embodiment is configured to measure the electric current flowing through the spray gun 2 simultaneously with application of the voltage to the spray gun 2 (i.e., by one process). This remarkably shortens the time required for checking the grounded state of the coating object CD and thereby enhances the productivity.

There is no need to provide a plurality of spray guns 2, in order to shorten the time for checking. This more effectively allows for downsizing and simplified configuration of production equipment and reduction of equipment cost.

Additionally, this embodiment makes the distance L1 smaller than the distance L2 and sets the sufficiently small distance L1. This more effectively increases the difference between the electric current flowing through the spray gun 2 in the normal grounded state of the coating object CD and the electric current flowing through the spray gun 2 in the abnormal grounded state of the coating object CD. This further facilitates determination of whether the grounded state of the coating object CD is normal or abnormal and further enhances the accuracy of checking the grounded state.

Setting the distance L1 to not less than 40 mm (or more preferably not less than 60 mm) more effectively prevents the spray gun 2 being in contact with the coating object CD and generation of a spark between the spray gun 2 and a jig or the like located in the periphery of the coating object CD even in the case of misalignment of the position of the coating object CD. This results in further enhancing the accuracy of checking the grounded state.

Setting the distance L1 to not greater than 100 mm (or more preferably not greater than 80 mm) further increases the difference between the electric current flowing through the spray gun 2 in the normal grounded state and the electric current flowing through the spray gun 2 in the abnormal grounded state. This results in further enhancing the accuracy of checking the grounded state.

[Second Embodiment]

The following describes a second embodiment with mainly focusing on the differences from the above first embodiment.

A second embodiment is configured to relatively move the spray gun 2 along a trajectory keeping the distance between the spray gun 2 and the coating object CD located at the normal position to L1 as illustrated in FIGS. 3 and 6A through 6D. The spray gun 2 under application of a voltage is located in at least three or more different positions (in at least positions A, B, C and D according to this embodiment) at a fixed distance from the coating object CD located at the normal position. The current measurement device 5 measures a plurality of electric currents IA, IB, IC and ID flowing through the spray gun 2 at the respective positions A, B, C and D (where IA denotes an electric current (current value) measured at the position A; IB denotes an electric current (current value) measured at the position B; IC denotes an electric current (current value) measured at the position C; and ID denotes an electric current (current value) measured at the position D).

Figure 7:
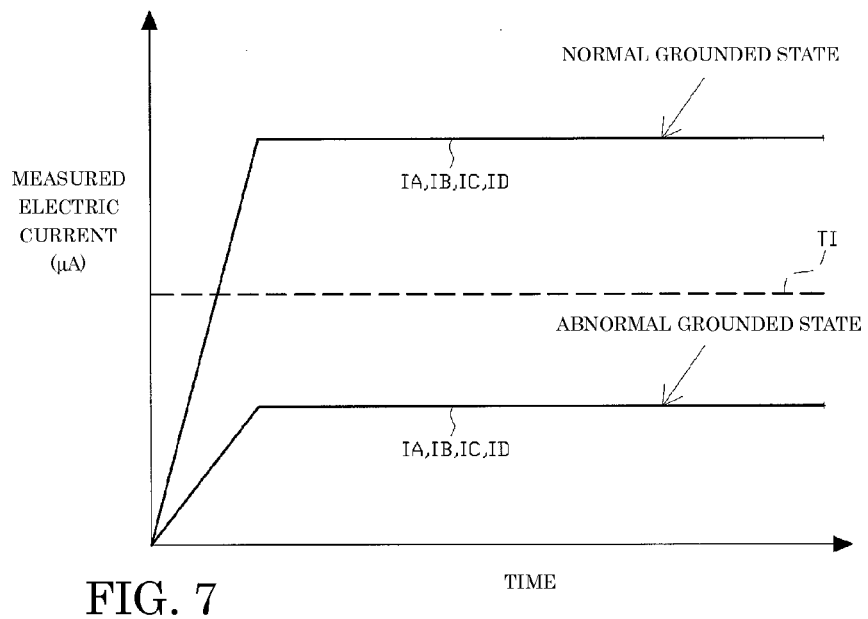
FIG. 7 is a graph showing electric currents measured by the current measurement device when the coating object is located at its normal position and a threshold current used to determined the grounded state of the coating object.
Figure 8:
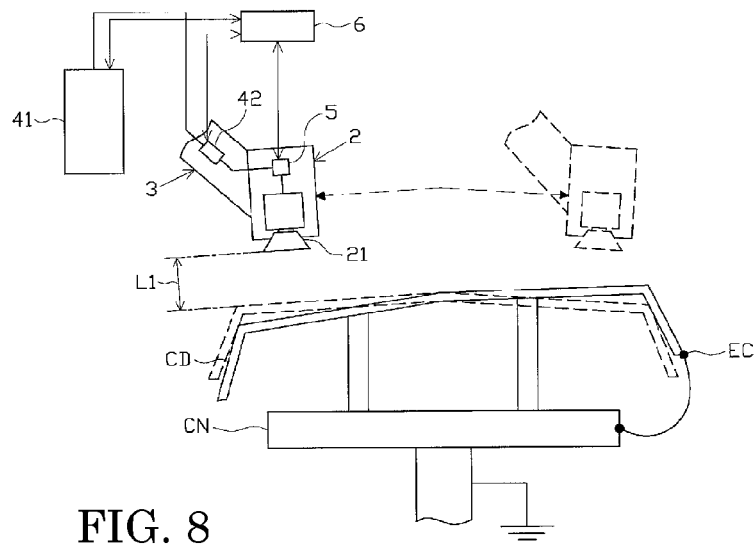
FIG. 8 is a diagram illustrating the coating object located at a position shifted from its normal position.

The plurality of electric currents (current values) IA, IB, IC and ID measured by the current measurement device 5 are input into the controller 6. The controller 6 determines the grounded state of the coating object CD, based on the plurality of input electric currents (current values) IA, IB, IC and ID. More specifically, the controller 6 determines that the grounded state of the coating object CD is normal when the maximum value of the electric currents (current values) IA, IB, IC and ID measured by the current measurement device 5 is not lower than a predetermined threshold current TI ($\mu$A) as shown in FIG. 7. The controller 6 determines that the grounded state of the coating object CD is abnormal, on the other hand, when the maximum value of the electric currents (current values) IA, IB, IC and ID measured by the current measurement device 5 is lower than the threshold current TI.

The determination of the grounded state of the coating object CD based on the maximum value of the plurality of electric currents (current values) measured by the current measurement device 5 is attributed to the following reason.

Figure 10:
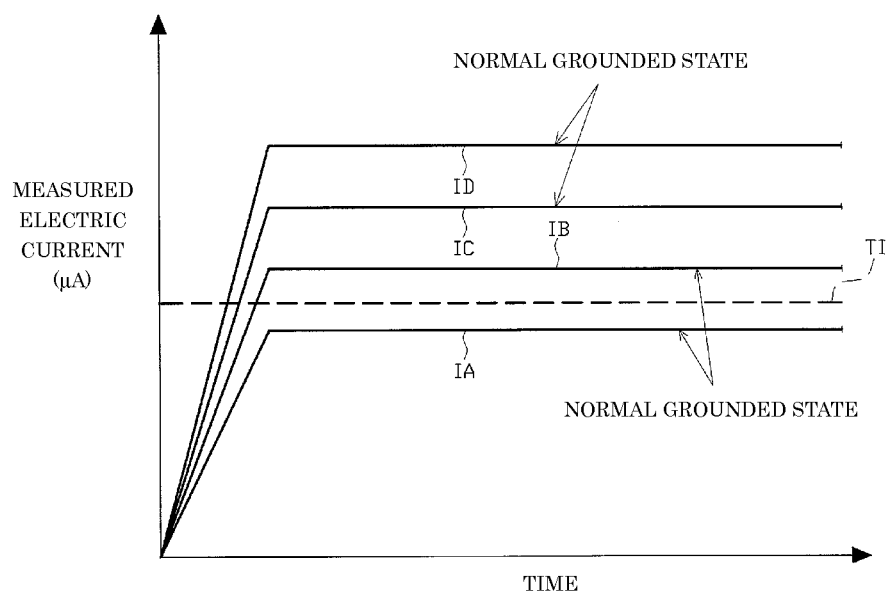
FIG. 10 is a graph showing electric currents measured by the current measurement device when the coating object is located at the position shifted from its normal position.

Even in the normal grounded state of the coating object CD, locating the coating object CD at a position shifted from the normal position differs the distance between the spray gun 2 and the coating object CD at the respective positions A, B, C and D as shown in FIGS. 8 and 9A through 9D. This varies the electric currents IA, IB, IC and ID measured at the respective positions A, B, C and D with the difference in distance as shown in FIG. 10. This may cause the measured electric current to be lower than the threshold current TI even in the normal grounded state of the coating object CD. By taking into account such possibility, this embodiment determines the grounded state of the coating object CD, based on the maximum value of the measured electric currents (current values) IA, IB, IC and ID.

Additionally, this second embodiment is configured to inform an operator or an equivalent of misalignment of the position of the coating object CD by the alarm device when the measured electric current (current value) has a predetermined change (for example, when the measured electric current gradually increases or gradually decreases).

As described above, this second embodiment is configured to locate the spray gun 2 under application of a voltage in at least three or more different positions at a fixed distance from the coating object CD located at the normal position, measure the electric currents flowing through the spray gun 2 at the respective positions and check the grounded state based on the plurality of measured electric currents. This further improves the accuracy of checking the grounded state.

Moreover, the second embodiment determines whether or not the position of the coating object CD is misaligned, based on the plurality of measured electric currents. This more effectively prevents the coating object CD with keeping the misalignment of the position from being subject to the coating process and more effectively controls the position of the spray gun 2 relative to the coating object CD to a desired position in the coating process. This results in effectively preventing a potential non-uniform coating and thus further enhances the coating quality.

[Third Embodiment]

The following describes a third embodiment with mainly focusing on the differences from the above first embodiment.

Figure 11:
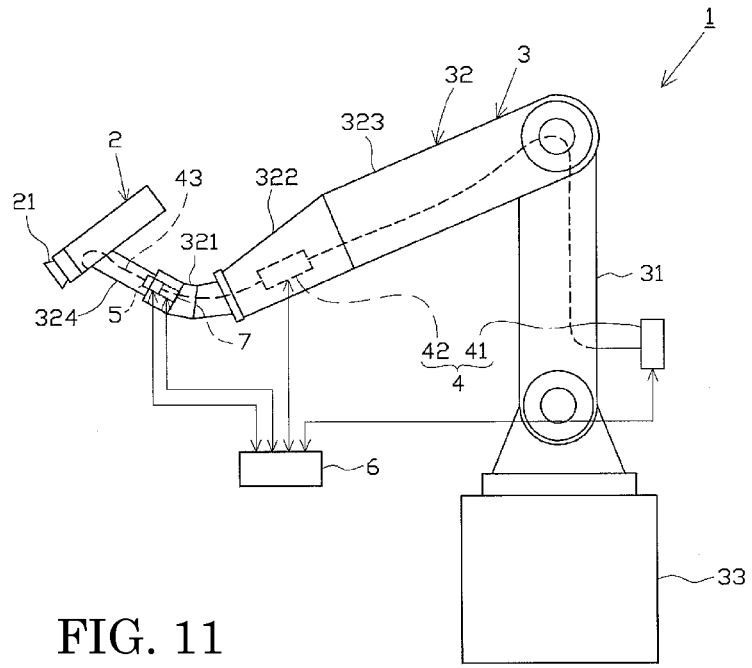
FIG. 11 is a diagram illustrating the configuration of an electrostatic coating apparatus according to a third embodiment.
Figure 12:
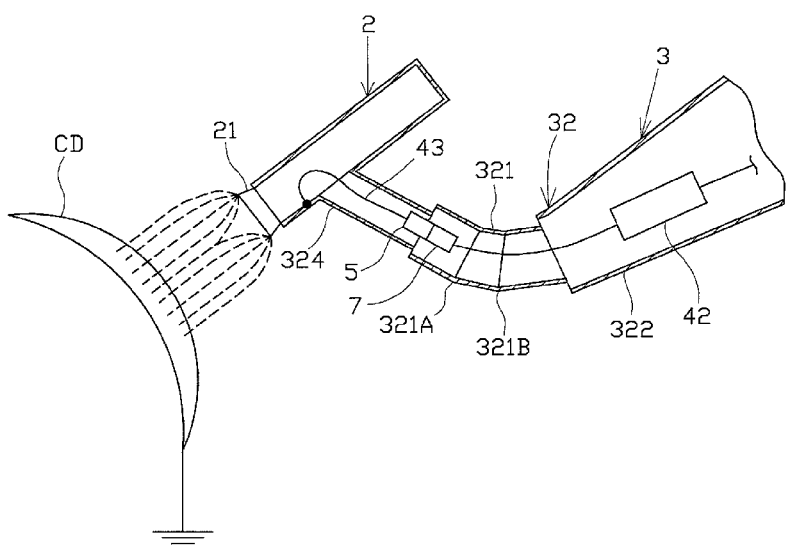
FIG. 12 is a diagram illustrating the structure of a spray gun and a robot arm according to the third embodiment.

According to this third embodiment, the electrostatic coating apparatus 1 has a surface potential measurement device 7 as illustrated in FIGS. 11 and 12. The surface potential measurement device 7 is provided downstream of the voltage booster 42 and is electrically connected with the spray gun 2. The surface potential measurement device 7 is configured to detect the discharge current flowing between the spray gun 2 and the coating object CD and measure the surface potential on the coating object CD based on the detected discharge current. Additionally, the surface potential measured by the surface potential measurement device 7 is output to the controller 6.

According to the third embodiment, the controller 6 is configured to check the grounded state of the coating object (conductive primer formed on the surface of the coating object CD in this embodiment), based on the electric current (current value) measured by the current measurement device 5 and the surface potential measured by the surface potential measurement device 7.

Figure 13:
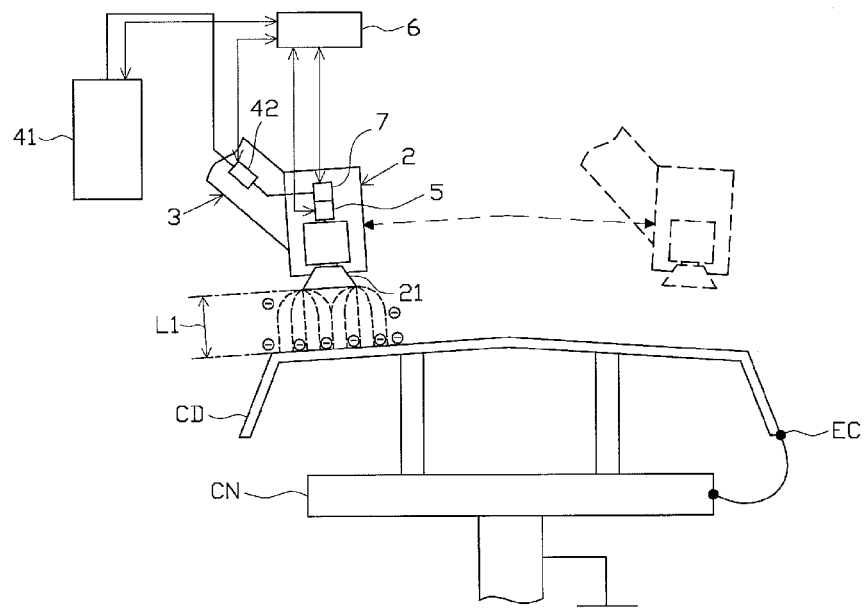
FIG. 13 is a diagram illustrating the spray gun during measurement of electric current flowing through the spray gun according to the third embodiment.

The following describes a procedure of checking in detail. As shown in FIG. 13, the procedure of this third embodiment measures the electric current flowing through the spray gun 2 under application of a high voltage to the spray gun 2 by using the current measurement device 5 and charges the coating object CD (conductive primer) by the spray gun 2.

Figure 14:
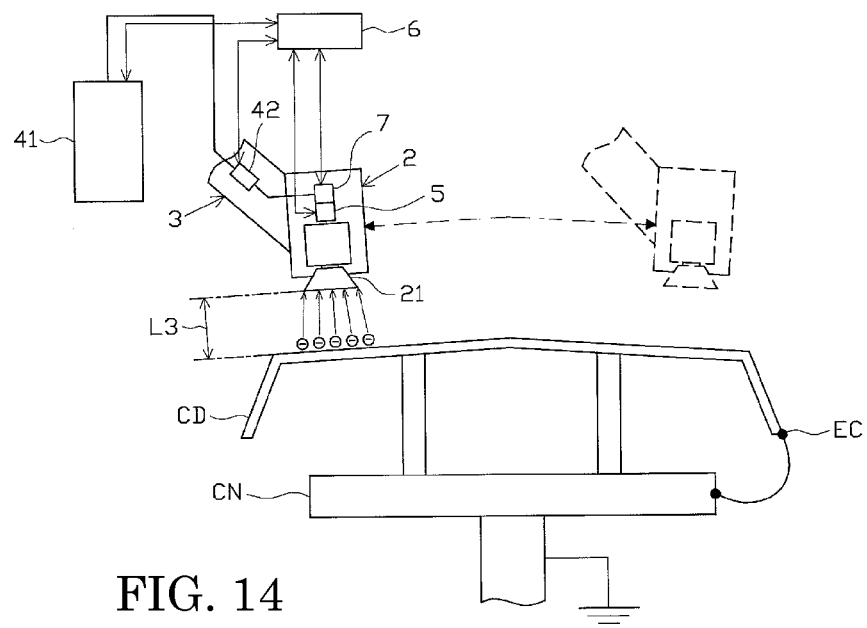
FIG. 14 is a diagram illustrating the spray gun during measurement of surface potential on the coating object.

When a predetermined waiting time t1 (for example, 0.2 second) has elapsed since charging of the coating object CD, as shown in FIG. 14, the procedure locates the spray gun 2 under no application of a high voltage from the voltage application device 4 (grounded spray gun 2 in this embodiment) at a distance from the coating object CD and relatively moves the spray gun 2 along a predetermined trajectory (trajectory passing over the entire surface area of the conductive primer in this embodiment). The procedure then detects the discharge current flowing between the spray gun 2 and the coating object CD by the charge of the charged coating object CD and measures the surface potential of the coating object CD based on the detected discharge current, by using the surface potential measurement devices 7.

The electric current (current value) measured by the current measurement device 5 and the surface potential measured by the surface potential measurement device 7 are input into the controller 6. The controller 6 then determines the grounded state of the coating object CD, based on the input electric current and surface potential.

Figure 15:
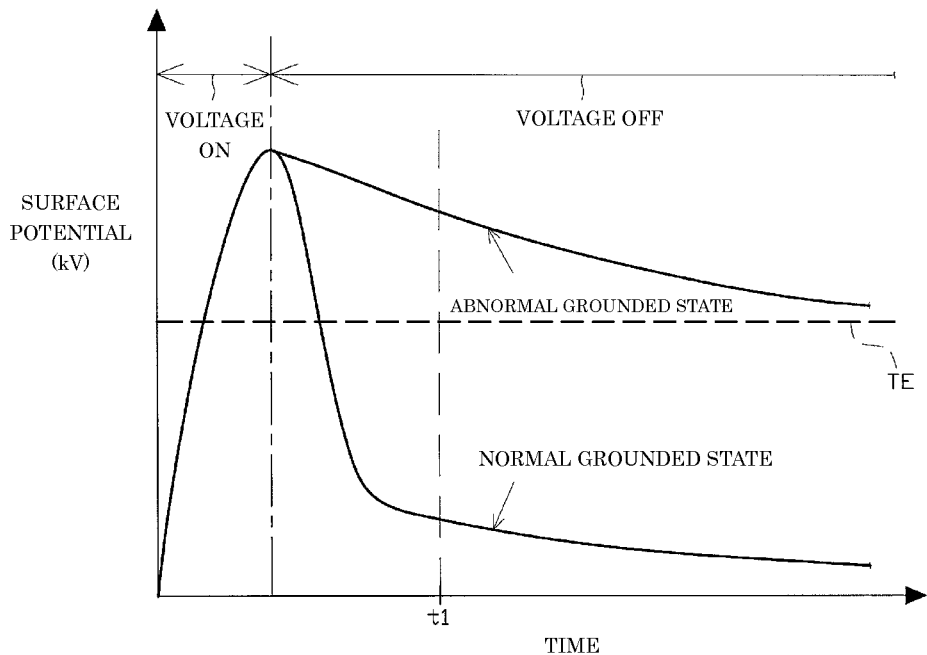
FIG. 15 is a graph showing surface potentials measured by a surface potential measurement device and a threshold voltage used to determine the grounded state of the coating object.

More specifically, in the case where the coating object CD (conductive primer) is normally grounded and the conductive primer is normally formed, the electric charge applied to the coating object CD by the spray gun 2 flows through the conductive primer toward the ground. This causes a relatively small charge to remain in the coating object CD and results in a relatively low surface potential measured by the surface potential measurement device 7 as shown in FIG. 15. By taking into account such state, the controller 6 determines that the grounded state of the coating object CD is normal when the maximum value of the electric current (current value) measured by the current measurement device 5 is not lower than a predetermined threshold current TI (μA) and when the surface potential measured by the surface potential measurement device 7 is not higher than a predetermined threshold voltage TE (kV).

In the case where some abnormality occurs on the grounding connection of the coating object CD (conductive primer) (for example, when the grounding clip EC is not attached or when conductive performance between the coating object CD and the ground is reduced by, for example, adhesion of an insulating coating material onto the grounding clip EC) or in the case where the conductive primer is not provided normally (for example, when the conductive primer is not formed), on the other hand, the electric charge applied to the coating object CD by the spray gun 2 remains in the coating object CD. This causes a relatively large charge to remain in the coating object CD and results in a relatively high surface potential measured by the surface potential measurement device 7 as shown in FIG. 15. By taking into account such state, the controller 6 determines that the grounded state of the coating object CD is abnormal when the maximum value of the electric current (current value) measured by the current measurement device 5 is lower than the predetermined threshold current TI or when the surface potential measured by the surface potential measurement device 7 is higher than the predetermined threshold voltage TE.

According to this third embodiment, a distance L3 between the spray gun 2 and the coating object CD (FIG. 14) during measurement of the surface potential of the coating object CD by the surface potential measurement device 7 is set to be smaller than the above distance L2 (FIG. 5).

As described above, the third embodiment is configured to check the grounded state of the coating object CD, based on both the measured electric current and the measured surface potential. This significantly enhances the accuracy of checking the grounded state.

Additionally, this embodiment is configured to charge the coating object CD when the spray gun 2 under application of a high voltage is located at a distance from the coating object CD for measurement of the electric current flowing through the spray gun 2. In other words, this embodiment is configured to measure the electric current flowing through the spray gun 2 simultaneously with charging the coating object CD (i.e., by one process). This effectively shortens the time required for checking the grounded state of the coating object CD and thereby enhances the productivity.

Additionally, this third embodiment makes the distance L3 smaller than the distance L2 and sets the sufficiently small distance L3. This more effectively increases the difference between the surface potential in the normal grounded state of the coating object CD and the surface potential in the abnormal grounded state of the coating object CD. This further facilitates determination of whether the grounded state of the coating object CD is normal or abnormal and further enhances the accuracy of checking the grounded state.

[Fourth Embodiment]

The following describes a fourth embodiment with mainly focusing on the differences from the above third embodiment.

According to this fourth embodiment, when determining that the grounded state of the coating object CD is abnormal, the controller 6 is configured to further identify the cause of the abnormal grounded state is attributed to poor primer (the conductive primer is not normally formed) or to poor grounding (the grounding connection of the coating object CD (conductive primer) is not reliable).

Figure 16:
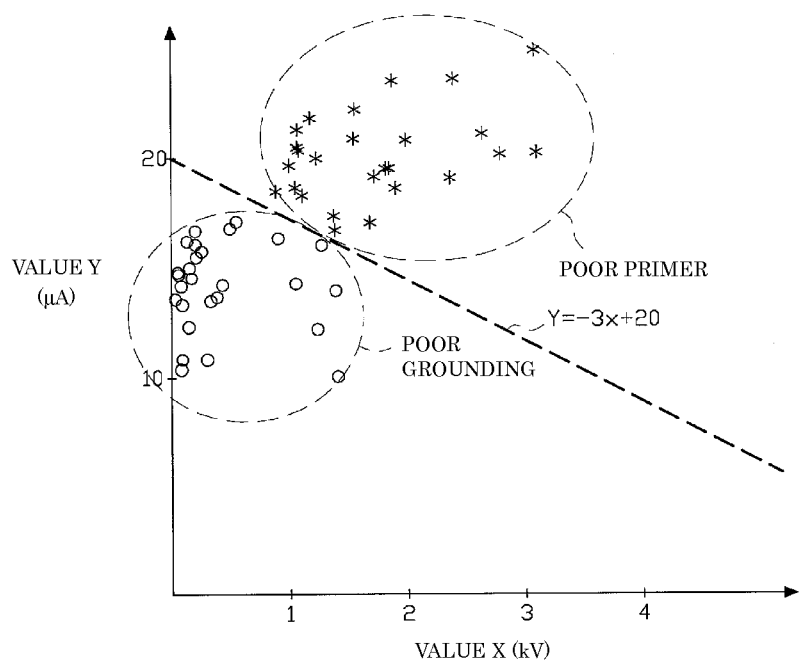
FIG. 16 is a graph showing an identification equation used to identify the cause as poor grounding or poor primer.

More specifically, the controller 6 calculates a value X (kV) by subtracting the surface potential on a coating object CD in the normal grounded state measured by the surface potential measurement device 7 (determined in advance under the same conditions as those of checking according to this embodiment) from the surface potential on a coating object CD as a test object measured by the surface potential measurement device 7. The controller 6 also calculates a value Y (μA) by subtracting the electric current on the coating object CD as the test object measured by the current measurement device 5 from the electric current on the coating object CD in the normal grounded state measured by the current measurement device 5 (determined in advance under the same conditions as those of checking according to this embodiment). The controller 6 identifies that the cause of the abnormal grounded state is attributed to poor primer when the values X and Y satisfy a relation of Y≥−3(μA/kV)×X+20 (μA) as shown in FIG. 16 (circles represent the values X and Y in the case of poor grounding and asterisks represent the values X and Y in the case of poor primer in FIG. 16).

When the values X and Y satisfy a relation of Y<−3(μA/kV)×X+20 (μA), on the other hand, the controller 6 identifies that the cause of the abnormal grounded state is attributed to poor grounding.

According to this embodiment, when the controller 6 determines that the grounded state of the coating object CD is abnormal, an operator or an equivalent is informed of the abnormal grounded state and the cause of the abnormal grounded state by the alarm device.

As described above, this fourth embodiment readily identifies the cause of the abnormal grounded state by comparing the value Y with the value obtained by substituting the value X in (−3X+20). As a result, the abnormal grounded state can be adequately handled by taking into account the cause of the abnormality.

[Fifth Embodiment]

The following describes a fifth embodiment with mainly focusing on the differences from the above third and fourth embodiments.

Figure 17:
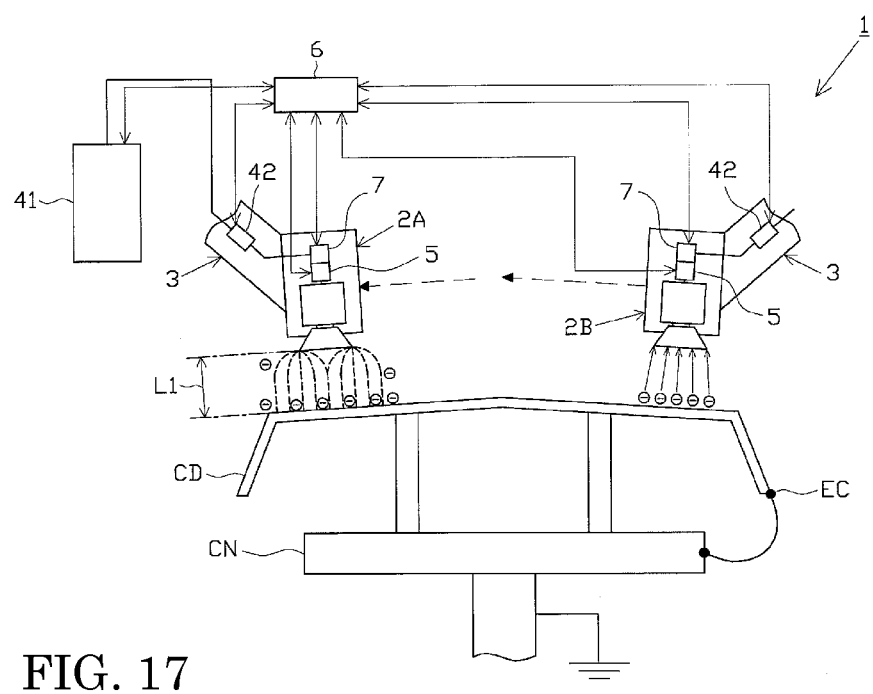
FIG. 17 is a diagram illustrating the configuration of an electrostatic coating apparatus according to a fifth embodiment.

Only one spray gun 2 is provided in the third and the fourth embodiments described above. According to this fifth embodiment, on the other hand, the electrostatic coating apparatus 1 has two spray guns, i.e., a first spray gun 2A and a second spray gun 2B, as illustrated in FIG. 17. The structure of both spray guns 2A and 2B is identical with the structure of the spray gun 2 according to the above embodiments. The spray guns 2A and 2B are respectively supported on robot arms 3 and are movable relative to the coating object CD by the motions of the robot arms 3.

Additionally, this fifth embodiment employs a different timing from that of the above third and fourth embodiments for measurement of the surface potential by the surface potential measurement device 7. More specifically, the above third and fourth embodiments locate the spray gun 2 under no application of a high voltage relative to the charged coating object CD after elapse of the predetermined waiting time t1 since charging of the coating object CD and measure the surface potential on the coating object CD by using the surface potential measurement device 7. The fifth embodiment is, on the other hand, configured to locate the second spray gun 2B under no application of a high voltage relative to a specific charged area of the coating object CD where application of charge has been completed and start measuring the surface potential of the coating object CD by the surface potential measurement device 7, while the coating object CD is being charged by the first spray gun 2A under application of a high voltage (i.e., before application of charge has not yet been fully completed for the entire coating object CD).

As described above, this fifth embodiment can start measurement of the surface potential on the coating object CD using the second spray gun 2B, while the coating object CD is being charged by the first spray gun 2A. This further shortens the time required for checking the grounded state and thereby enhances the productivity.

The invention is not limited to the descriptions of the above embodiments but may be changed or modified, for example, as described below. Various applications and modifications other than those described below should be construed to be in the scope of the invention.

(a) In the embodiments described above, the grounded state of the coating object CD is checked by using the maximum value of the electric current measured by the current measurement device 5 as the criterion for determination. The criterion for determination is, however, not necessarily the maximum value. For example, the grounded state of the coating object CD may be checked, based on an average value of the measured electric current.

(b) In the embodiments described above, the electrostatic coating apparatus 1 includes one or two spray guns 2. The electrostatic coating apparatus 1 may, however, include three or more spray guns 2.

(c) In the embodiments described above, the voltage application device 4 and the current measurement device 5 are provided as discrete devices. These two devices may, however, be integrated. For example, the voltage application device 4 may be configured to have the functions of the current measurement device 5.

In the third to the fifth embodiments described above, the voltage application device 4, the current measurement device 5 and the surface potential measurement device 7 are provided as discrete devices. All these devices may, however, be integrated or any two of these devices may be integrated. For example, the voltage application device 4 may be configured to have the functions of the surface potential measurement device 7.

The invention claimed is:

1. An electrostatic coating apparatus, comprising:
a spray gun configured to spray a coating material onto a coating object;
a voltage application device configured to apply a high voltage to the spray gun; and
a current measurement device configured to measure electric current flowing through the spray gun, wherein
the electrostatic coating apparatus is configured to locate the spray gun, which is in a state of not spraying the coating material onto the coating object and is under application of the high voltage from the voltage application device, at a distance from the coating object, so as to measure the electric current flowing through the spray gun by the current measurement device,
the electrostatic coating apparatus being configured to check a grounded state of the coating object, based on the electric current measured by the current measurement device.

2. The electrostatic coating apparatus according to claim 1, wherein the electrostatic coating apparatus is configured to locate the spray gun which is under application of the high voltage from the voltage application device, in at least three or more different positions at a fixed distance from the coating object located at its normal position, so as to measure the electric current flowing through the spray gun by the current measurement device at each of the three or more different positions,
the electrostatic coating apparatus being configured to check the grounded state of the coating object, based on a plurality of the electric currents measured by the current measurement device.

3. The electrostatic coating apparatus according to claim 1, further comprising:
a surface potential measurement device electrically connected with the spray gun and configured to measure a surface potential on the coating object, wherein
the electrostatic coating apparatus is configured to locate the spray gun, which is in the state of not spraying the coating material onto the coating object and is under application of the high voltage from the voltage application device, at a distance from the coating object, so as to charge the coating object, while being configured to locate the spray gun, which is under no application of the high voltage from the voltage application device, at a distance from the coating object, so as to measure the surface potential on the coating object by the surface potential measurement device, the electrostatic coating apparatus being configured to check the grounded state of the coating object, based on the electric current measured by the current measurement device and the surface potential measured by the surface potential measurement device.

4. The electrostatic coating apparatus according to claim 3, wherein when the grounded state of the coating object is abnormal, the electrostatic coating apparatus is configured to identify a cause of the abnormal grounded state, based on the electric current measured by the current measurement device and the surface potential measured by the surface potential measurement device.

5. The electrostatic coating apparatus according to claim 4, wherein the electrostatic coating apparatus is configured to identify the cause of the abnormal grounded state by comparison between a value Y (kV) and a calculated value by substituting a value X (kV) into $-3\ (\mu A/kV) \times X + 20\ (\mu A)$, where the value X is calculated by subtracting the surface potential on the coating object in a normal grounded state measured by the surface potential measurement device from the surface potential on the coating object as a test object measured by the surface potential measurement device, and the value Y is calculated by subtracting the electric current on the coating object as the test object measured by the current measurement device from the electric current on the coating object in the normal grounded state measured by the current measurement device.

6. The electrostatic coating apparatus according to claim 3, wherein the electrostatic coating apparatus is configured to locate the spray gun, which is in the state of not spraying the coating material onto the coating object and is under application of the high voltage from the voltage application device, at a distance from the coating object, so as to measure the electric current flowing through the spray gun by the current measurement device and charge the coating object by the spray gun.

7. The electrostatic coating apparatus according to claim 3, wherein the spray gun includes a first spray gun and a second spray gun, wherein the electrostatic coating apparatus is configured to locate the first spray gun, which is under application of the high voltage from the voltage application device, at a distance from the coating object, so as to charge the coating object, while being configured to locate the second spray gun, which is under no application of the high voltage from the voltage application device, at a distance from the coating object, so as to measure the surface potential on the coating object by the surface potential measurement device.

8. The electrostatic coating apparatus according to claim 3, wherein a distance between the spray gun and the coating object during measurement of the surface potential on the coating object by the surface potential measurement device is made smaller than a distance between the spray gun and the coating object during coating of the coating object by the spray gun.

9. The electrostatic coating apparatus according to claim 1, wherein a distance between the spray gun and the coating object during measurement of the electric current flowing through the spray gun by the current measurement device is made smaller than a distance between the spray gun and the coating object during coating of the coating object by the spray gun.

10. The electrostatic coating apparatus according to claim 1, wherein a distance between the spray gun and the coating object is not less than 40 mm and not greater than 100 mm during measurement of the electric current flowing through the spray gun by the current measurement device.

11. The electrostatic coating apparatus according to claim 1, wherein a distance between the spray gun and the coating object is not less than 60 mm and not greater than 80 mm during measurement of the electric current flowing through the spray gun by the current measurement device.

12. A grounded state checking method of checking a grounded state of a coating object in an electrostatic coating apparatus comprising a spray gun configured to spray a coating material onto a coating object and a voltage application device configured to apply a voltage to the spray gun, the grounded state checking method comprising:
measuring an electric current flowing through the spray gun when the spray gun, which is under application of a high voltage by the voltage application device, is located at a distance from the coating object; and
checking a grounded state of the coating object, based on the measured electric current.

13. The grounded state checking method according to claim 12,
wherein the measuring the electric current flowing through the spray gun is performed when the spray gun, which is in a state of not spraying the coating material onto the coating object, is located in at least three different positions at a fixed distance from the coating object located in its normal position.

14. The grounded state checking method according to claim 12, further comprising:
charging the coating object and measuring a surface potential on the coating object when the spray gun, which is under application of a voltage by the voltage application device, is located at a distance from the coating object; and
checking the grounded state of the coating object, based on the measured electric current and the measured surface potential.

15. The grounded state checking method according to claim 14, further comprising:
when the grounded state of the coating object is abnormal, identifying a cause of the abnormal grounded state, based on the measured electric current and the measured surface potential.

16. The grounded state checking method according to claim 15,
wherein the identifying the cause of the abnormal grounded state is performed by comparison between a value Y (kV) and a calculated value by substituting a value X (kV) into $-3\ (\mu A/kV) \times X + 20\ (\mu A)$, where the value X is calculated by subtracting the measured surface potential on the coating object in a normal grounded state from the measured surface potential on the coating object as a test object, and the value Y is calculated by subtracting the measured electric current on the coating object as the test object from the measured electric current on the coating object in the normal grounded state.

17. The grounded state checking method according to claim 14, further comprising:
measuring the electric current flowing through the spray gun and charging the coating object by the spray gun when the spray gun, which is in a state of not spraying the coating material onto the coating object and is under application of a high voltage from the voltage application device, is located at a distance from the coating object.

18. The grounded state checking method according to claim 14, further comprising:
starting measuring the surface potential on the coating object, while charging the coating object.

19. The grounded state checking method according to claim 14,
wherein a distance between the spray gun and the coating object during measurement of the surface potential on the coating object is made smaller than a distance between the spray gun and the coating object during coating of the coating object by the spray gun.

20. The grounded state checking method according to claim 12,
wherein a distance between the spray gun and the coating object during measurement of the electric current flowing through the spray gun is made smaller than a distance between the spray gun and the coating object during coating of the coating object by the spray gun.

21. The grounded state checking method according to claim 12,
wherein a distance between the spray gun and the coating object is not less than 40 mm and not greater than 100 mm during measurement of the electric current flowing through the spray gun.

22. The grounded state checking method according to claim 12,
wherein a distance between the spray gun and the coating object is not less than 60 mm and not greater than 80 mm during measurement of the electric current flowing through the spray gun.

* * * * *